United States Patent [19]
Ishigaki

[11] Patent Number: 4,635,004
[45] Date of Patent: Jan. 6, 1987

[54] SINGLE-SIDEBAND GENERATOR SUITABLE FOR INTEGRATED CIRCUITS

[75] Inventor: Yukinobu Ishigaki, Tokyo, Japan

[73] Assignee: Victor Company of Japan, Ltd., Japan

[21] Appl. No.: 813,862

[22] Filed: Dec. 27, 1985

[30] Foreign Application Priority Data

Jan. 4, 1985 [JP] Japan ............................. 60-58
Feb. 4, 1985 [JP] Japan ............................. 60-19642

[51] Int. Cl.$^4$ ............................................. H03C 1/60
[52] U.S. Cl. .......................................... 332/45; 332/48; 455/47; 455/109
[58] Field of Search ..................... 332/31 R, 31 T, 45, 332/48; 455/47, 109

[56] References Cited

U.S. PATENT DOCUMENTS 3,573,380 4/1971 Darlington ...................... 332/45 X
3,611,144 10/1971 Harmon, Jr. et al. ............ 455/47 X
4,511,864 4/1985 de Riviére332 ............................. 41/

Primary Examiner—Siegfried H. Grimm
Attorney, Agent, or Firm—Lowe, Price, Leblanc, Becker & Shur

[57] ABSTRACT

A single-sideband generator comprising a 90-degree phase shifter to which a modulating signal is applied, a modulator, and a switching circuit for alternately switching the delayed and nondelayed modulating signals to the modulator at a rate corresponding to the frequency of a carrier. A frequency divider is provided for halving the frequency of the carrier and applying its output to the modulator to cause it to modulate the divider output with the output of the switching circuit. In a preferred embodiment, the modulator comprises a balanced modulator.

6 Claims, 4 Drawing Figures

SINGLE-SIDEBAND GENERATOR SUITABLE FOR INTEGRATED CIRCUITS

BACKGROUND OF THE INVENTION

The present invention relates to a single-sideband generator.

Single-sideband generation is a well known technique for transmitting as many channels as possible on the limited bandwidth of a transmission system. One known method is to use a balanced modulator which modulates a carrier with a modulating signal to produce a carrier-suppressed both-sideband signal which is filtered through a complex band-pass filter to obtain a single-sideband signal. Another typical method for single-sideband generation is to employ two 90-degree phase shifters for respectively delaying the phase of a modulating signal and a carrier by 90 degrees each. The delayed modulating signal and carrier are respectively applied to the inputs of a first balanced modulator. The original modulating signal and carrier, both advanced by 90 degrees from the outputs of the phase shifters, are applied respectively to the inputs of a second balanced modulator. The outputs of the modulators are combined in an adder to produce a single sideband signal which is filtered through a low-pass filter to eliminate the high-frequency component.

For a monolithic integrated circuit chip it is important to reduce the number of pin terminals for connection to outside circuitry in order to reduce the cost of the chip. To design a monolithic integrated circuit chip for a single-sideband generator, a number of capacitors employed in the generator must be located outside the chip and connected through pin terminals. The pin terminals thus increase with the number of capacitors employed in the single-sideband generator. The above-mentioned prior art single-sideband generators are not satisfactory in terms of the number of capacitors.

SUMMARY OF THE INVENTION

Accordingly, it is an object of the present invention to provide a single-sideband generator having a smaller number of capacitors than prior art single-sideband generators.

The single-sideband generator according to a broader aspect of the present invention comprises a 90-degree phase shifter for delaying a modulating signal by 90 degree, a modulator, and a switching circuit for alternately switching the delayed and nondelayed modulating signals to the modulator at a rate corresponding to the frequency of a carrier. A frequency divider is provided for halving the frequency of the carrier and applying its output to the modulator to cause it to modulate the divider output with the output of the switching circuit.

In a first preferred embodiment, the modulator comprises a balanced modulator.

In a second preferred embodiment, the switching circuit comprises first and second switches for alternately switching the delayed and nondelayed modulating signals at a rate corresponding to the frequency of the carrier, and the modulator comprises a first subtractor having first and second inputs for respectively receiving the outputs of the first and second switches, a second subtractor having first and second inputs, and third and fourth switches for switching the output of the first subtractor alternately to the first and second inputs of the second subtractor at a rate corresponding to the frequency of the output of the divider.

BRIEF DESCRIPTION OF THE DRAWINGS

The present invention will be described in further detail with reference to the accompanying drawings, in which.

DETAILED DESCRIPTION

Figure 1:
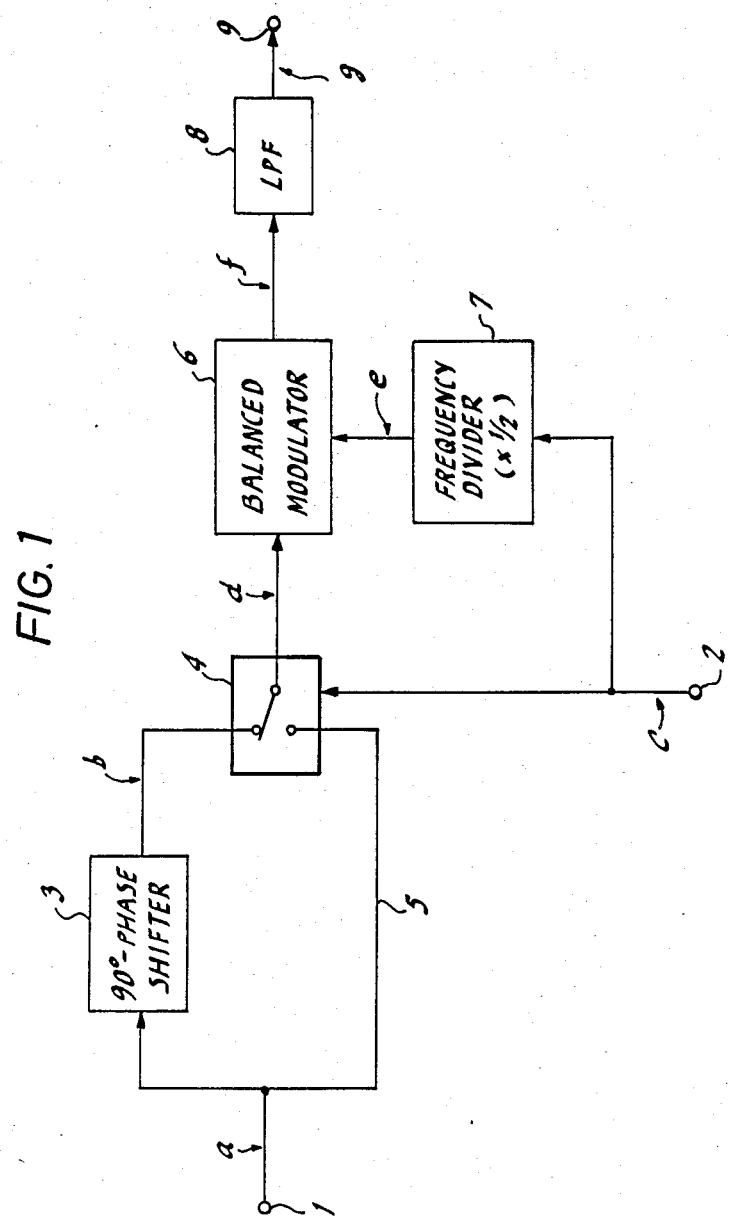
FIG. 1 is a block diagram of a first embodiment of the present invention.

Referring now to FIG. 1, there is shown a single-sideband generator according to a first preferred embodiment of the invention. The generator is in receipt of a modulating signal at terminal 1 and a carrier at terminal 2. The modulating signal is shown as a sinusoid "a" and the carrier as a series of rectangular pulses "c" in FIG. 2. The modulating signal is applied through a 90-degree phase shifter 3 to one terminal of an electronic analog changeover switch 4 and directly through a line 5 to the other terminal of the switch 4. The carrier is applied to the control input of the switch 4 to alternately couple the 90-degree phase-delayed signal, which is shown at "b" in FIG. 2, and the non-delayed signal "a" to generate a signal which is in the form of a chopped waveform "d" in FIG. 2. Waveform "d" is applied to one input of a balanced modulator 6 of the type which is well known in the art. The carrier at terminal 2 is also applied to a divide-by-two frequency divider 7, the output of which (shown at "e" in FIG. 2) is applied to the other input of balanced modulator 6.

Figure 2:
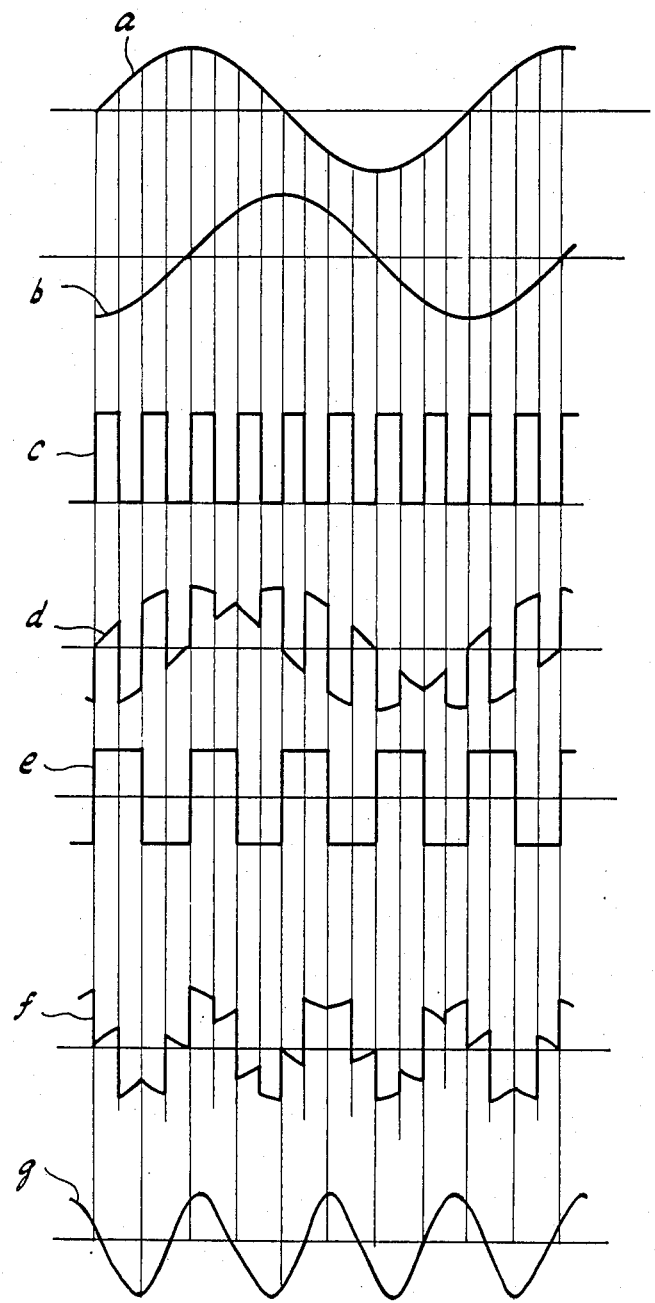
FIG. 2 is a timing diagram associated with the first embodiment.

Since the balanced modulator operates as an analog multiplier, the output of balanced modulator 6 is a result of multiplication of waveforms "d" and "e" as shown at "f" in FIG. 2. The output of balanced modulator 6 contains high-frequency components which are eliminated by a low-pass filter 8 to produce a single-sideband signal of sinusoidal wave "g" which is applied to output terminal 9.

It is seen that the single-sideband generator of the invention requires only one phase shifter and a low-pass filter, whereas the prior art single-sideband generator requires two phase shifters and a low-pass filter.

Figure 3:
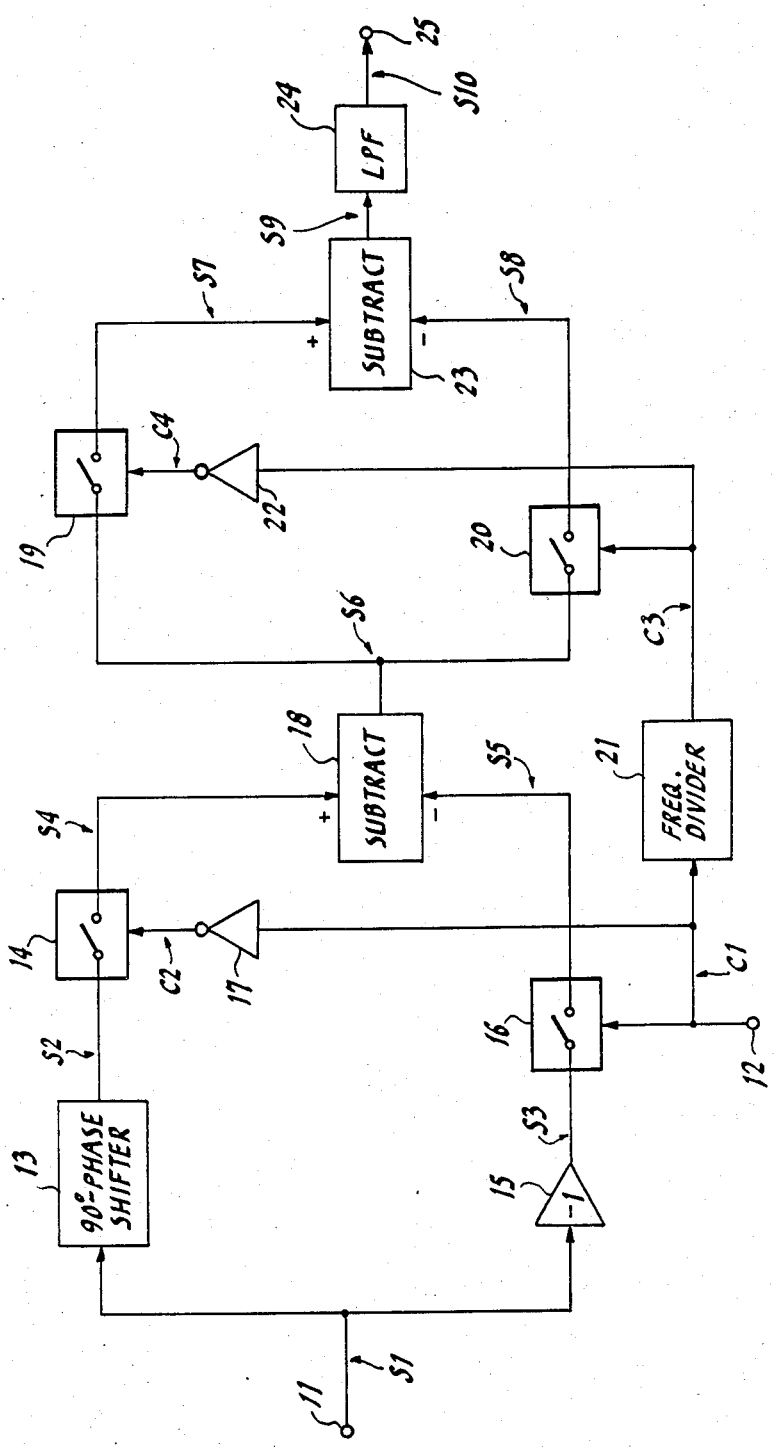
FIG. 3 is a block diagram of a second embodiment of the invention.
Figure 4:
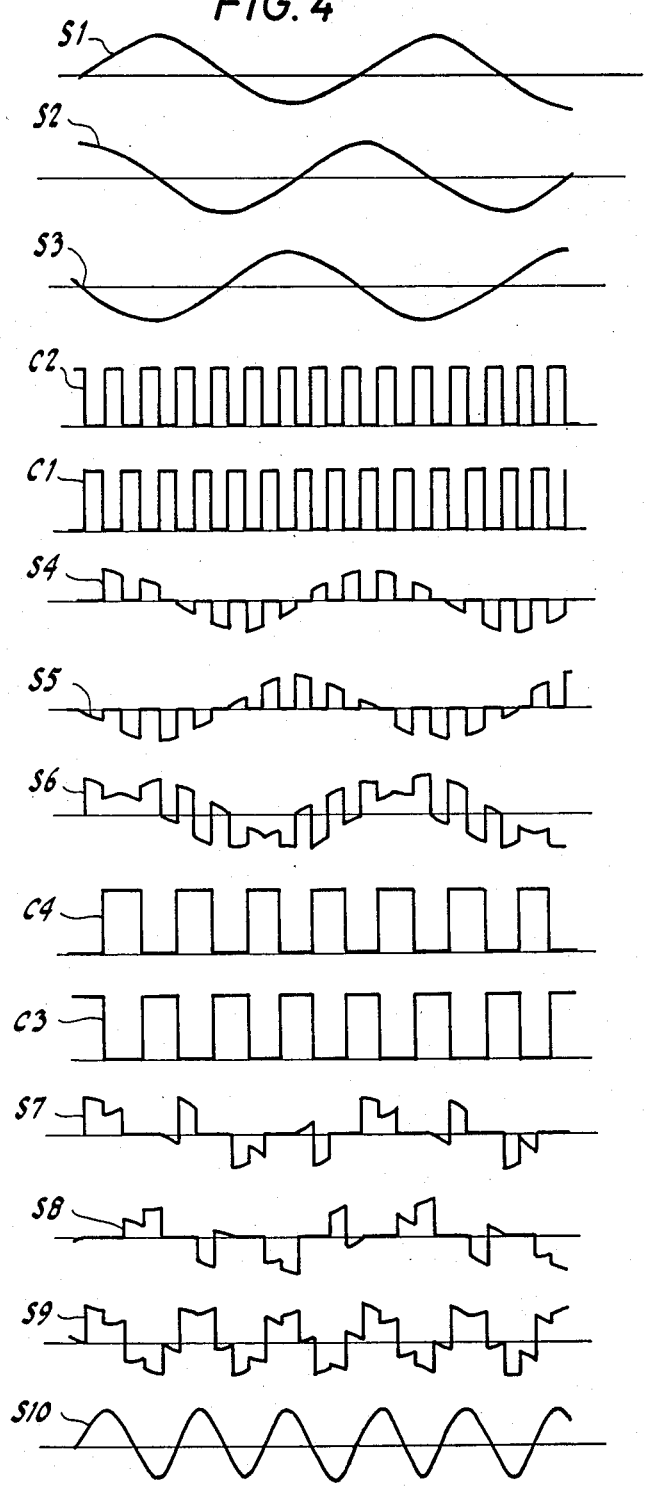
FIG. 4 is a timing diagram associated with the second embodiment.

FIG. 3 is an illustration of the single-sideband generator according to a second preferred embodiment of the invention. This generator is in receipt of a modulating signal S1 (FIG. 4) at terminal 11 and a carrier C1 at terminal 12. The modulating signal S1 at terminal 11 is passed through a 90-degree phase shifter 13 to provide an output S2 which is fed to an electronic analog switch 14 on the one hand, and through an analog inverter 15 to provide an output S3 which is fed to a second electronic analog switch 16 on the other hand. The carrier C1 at terminal 12, which is a series of rectangular pulses as in the previous embodiment, is passed through an inverter 17 to supply a switching signal C2 to the control input of switch 14 on the one hand. To the control input of the second switch 16 is directly applied the carrier C1, so that switches 14 and 16 operate in mutually exclusive times to chop their respective inputs to form chopped waveforms S4 and S5, respectively. Waveforms S4 and S5 are respectively applied to the positive and negative inputs of a subtractor 18. The substraction results in a waveform S6 which is fed from subtractor 18 to electronic analog switches 19 and 20.

The carrier C1 is also applied to a divide-by-two frequency divider 21 to supply a carrier C3 to the control input of switch 20 on the one hand, and further applied to an inverter 22 to supply a carrier C4 to the control input of switch 19, as a result of which switches 19 and 20 operate in mutually exclusive times. By the switching actions of switches 19 and 20, the output S6 of subtractor 18 is chopped into waveforms S7 and S8 at alternate intervals which are twice the intervals at which the analog modulating signals S2 and S3 are chopped. Chopped waveforms S7 and S8 are applied to the positive and negative inputs of a subtractor 23 to generate a signal S9. Differently stated, subtractor 23 inverts the polarity of the waveform S8 and adds it to the waveform S7. The high-frequency components of the output S9 of subtractor 23 are eliminated by a low-pass filter 24 to produce a single-sideband signal of sinusoidal wave S10 to be applied to output terminal 25.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A single-sideband generator, comprising:
   90-degree phase shifter means for delaying the phase of a modulating signal by 90 degrees;
   modulator means;
   switching means for alternately switching the delayed and nondelayed modulating signals to the modulator means at a rate corresponding to the frequency of a carrier; and
   frequency divider means for halving the frequency of said carrier and applying the frequency-halved carrier to said modulator means to cause it to modulate the frequency-halved carrier with the output of said switching means.

2. A single-sideband generator as claimed in claim 1, further comprising a low-pass filter connected to the output of said modulator means.

3. A single-sideband generator as claimed in claim 1, wherein said modulator means comprises a balanced modulator.

4. A single-sideband generator as claimed in claim 1, wherein said switching means comprises first and second switch means for alternately switching the delayed and nondelayed modulating signals at a rate corresponding to the frequency of said carrier, and wherein said modulator means comprises:
   a first subtractor having first and second inputs for respectively receiving said outputs alternately switched by said first and second switch means;
   a second subtractor having first and second inputs; and
   third and fourth switch means for switching the output of said first subtractor alternately to the first and second inputs of said second subtractor at a rate corresponding to the frequency of the output of said divider.

5. A single-sideband generator as claimed in claim 4, further comprising an inverter connected between an input terminal for said nondelayed modulating signals and said second switch means.

6. A single-sideband generator as claimed in claim 4, further comprising a low-pass filter connected to the output of said second subtractor.

* * * * *